United States Patent
Shelton

(10) Patent No.: US 9,893,216 B1
(45) Date of Patent: Feb. 13, 2018

(54) POLARIZED LIGHT BASED SOLAR CELL

(71) Applicant: Steven Wade Shelton, Berkeley, CA (US)

(72) Inventor: Steven Wade Shelton, Berkeley, CA (US)

(*) Notice: Subject to any disclaimer, the term of this patent is extended or adjusted under 35 U.S.C. 154(b) by 58 days.

(21) Appl. No.: 14/545,022

(22) Filed: Mar. 16, 2015

Related U.S. Application Data

(60) Provisional application No. 61/967,868, filed on Mar. 27, 2014.

(51) Int. Cl.
| | | |
|---|---|---|
| H01L 31/04 | (2014.01) | |
| H01L 31/0216 | (2014.01) | |
| G02B 5/30 | (2006.01) | |
| H02S 40/22 | (2014.01) | |

(52) U.S. Cl.
CPC ...... *H01L 31/02168* (2013.01); *G02B 5/3016* (2013.01); *H02S 40/22* (2014.12)

(58) Field of Classification Search
CPC .. H01L 31/02167; H01L 31/048; H01L 31/02
See application file for complete search history.

(56) References Cited

U.S. PATENT DOCUMENTS

| | | | | |
|---|---|---|---|---|
| 2,986,644 | A * | 5/1961 | Cheroff | G02B 27/28 136/260 |
| 3,760,257 | A * | 9/1973 | Fletcher | H01L 31/04 136/244 |
| 6,433,487 | B1 * | 8/2002 | Yamazaki | H01L 27/3281 136/261 |
| 6,518,493 | B1 * | 2/2003 | Murakami | H01L 31/02167 136/244 |
| 2004/0175500 | A1 * | 9/2004 | Fujisawa | C03C 17/002 427/255.28 |
| 2007/0215195 | A1 * | 9/2007 | Buller | H01L 31/03528 136/243 |
| 2010/0003480 | A1 * | 1/2010 | Agata | G02F 1/1333 428/213 |
| 2011/0010911 | A1 * | 1/2011 | Baldo | H01L 31/055 29/428 |
| 2012/0118381 | A1 * | 5/2012 | Debije | G02B 6/004 136/259 |

* cited by examiner

*Primary Examiner* — Golam Mowla
(74) *Attorney, Agent, or Firm* — Lawrence Edelman; The Law Office of Lawrence Edelman

(57) ABSTRACT

A solar cell is provided wherein a circular polarizer is positioned proximate a transparent conductor layer which itself is separated from a loop of conductive metal by an electrically insulative layer. Upon exposure to non-polarized light, a portion of the incident light is polarized and transmitted to the transparent conductor layer. Under the influence of this polarized light, free electrons in the conductor layer are induced to move in a circular motion, thereby generating magnetic fields. These magnetic fields drive the flow of current within the conductive metal loop.

2 Claims, 7 Drawing Sheets

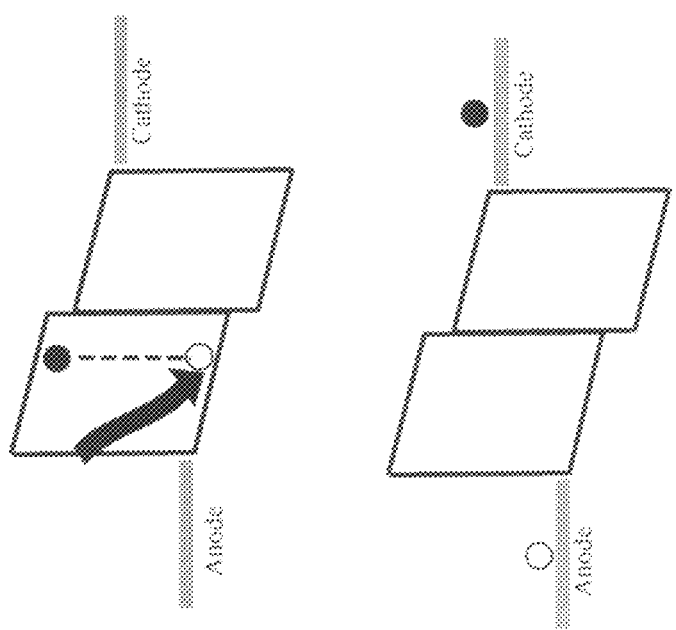

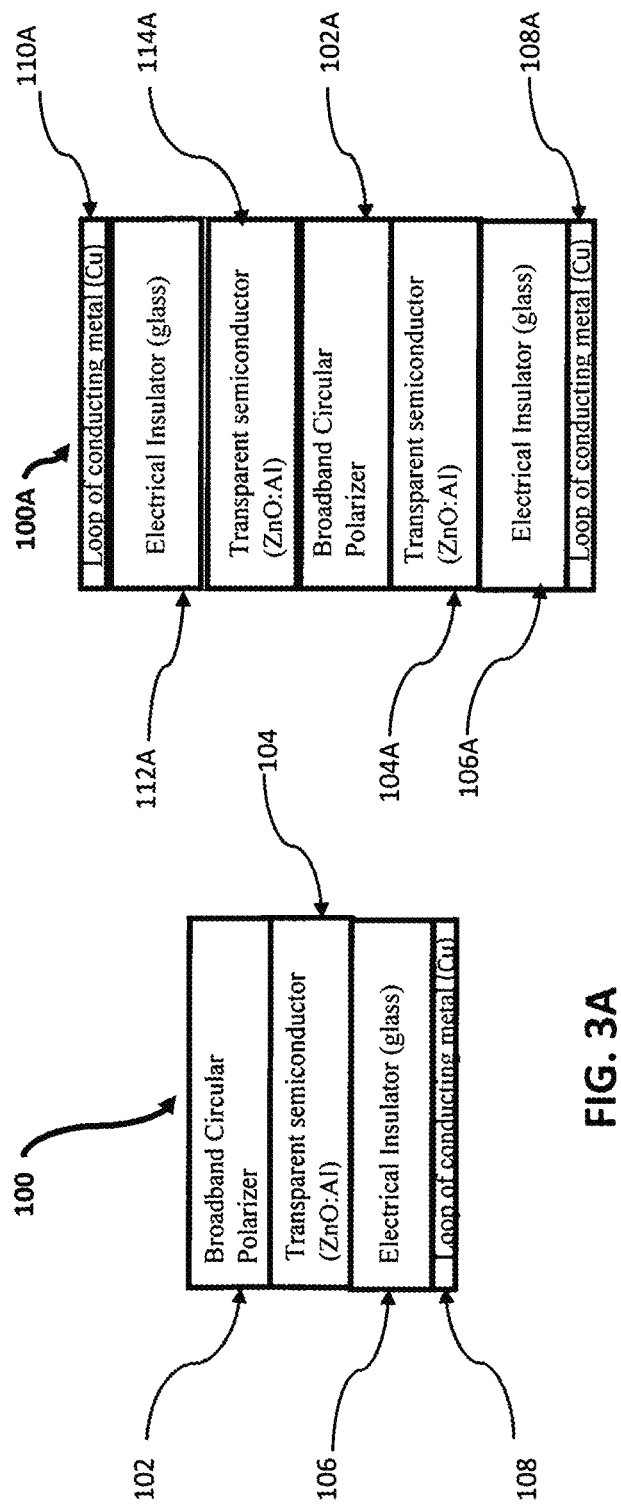

POLARIZED LIGHT BASED SOLAR CELL

CROSS REFERENCE TO RELATED CASE

This Application claims priority to U.S. Provisional Application 61/967,868, filed Mar. 27, 2014, entitled Polarized Light Based Solar Cell.

STATEMENT OF GOVERNMENT SUPPORT

None

FIELD OF INVENTION

This invention relates to a solar cell device and method for making same wherein a film of a light polarizing substance is coated onto a transparent semiconductor, the transmitted light used to generate a magnetic field. The magnetic field in turn drives a current in an electrode disposed below the semiconductor for the generation of electricity. Thus, using readily available, inexpensive materials, an inexpensive solar cell alternative is provided.

BACKGROUND OF THE INVENTION

Presently the most ubiquitous candidate for supplying solar energy is still the silicon-based module using a p-n junction. The p-n junction refers to the interface between two segments of silicon that have been doped with impurities, such as boron or phosphorus so that there is a preponderance of holes and electrons in these two segments, respectively. The majority charge carrier in the boron-doped segment is the hole and this segment is denoted as p-type. The majority charge carrier in the phosphorus-doped segment is the electron and this segment is denoted as n-type. As shown in FIG. 1A, upon light absorption (the arrow) an electron (black circle) is promoted from the valence band to the conduction band leaving a hole (white circle) in the valence band. These carriers are free to drift under the influence of the energetic gradient established by the p-n junction to their respective electrodes, as illustrated in FIG. 1B, for electricity production.

The environmental abundance of silicon coupled with accumulated knowledge on the operation of the device is what makes it commercially attractive. Furthermore, for every doubling of cumulative production there has been a 20% cost reduction over the past 30 years. Industry leaders such as Sunpower are selling modules that are 20% efficient and are achieving huge cost savings as they scale up production.

A common trend among solar panel manufacturers is to increase module efficiency in hopes that fewer solar panels will be required to generate a given amount of power. Reducing the total number of panels also helps reduce the balance of systems (BOS) cost, typically roughly $1.30/Watt for utility-scale power generation. Even for state-of-the-art silicon based cells sold by companies like Sunpower, the high BOS cost is not necessarily because of the module itself, but because of all the additional components that must be installed with it. The BOS includes the land on which the module is mounted, the mounting, monitoring systems, and labor. While the module alone may cost about $0.70/Watt, the BOS increases costs by roughly $1.30/Watt, making the entire installation nearly twice as expensive as the current $1/Watt threshold for market competitiveness. Even the installation of a free module would be prohibited because the BOS cost of $1.30/W is excessive.

Any high performing solar panel must absorb light, generate electric current, and conduct electric current very well. Silicon based solar panels clearly have many merits, but also have significant shortcomings. One of the most prominent limitations of these modules is thermalization after light absorption, which reduces the energy available to do electrical work. When an electron-hole pair is excited optically with energy greater than the band gap of silicon, 1.1 eV, the electron reaches a state higher than the conduction band edge, then relaxes back to the band edge by rapidly emitting thermal energy. In essence, any photon energy greater than 1.1 eV is thus wasted in this process of thermalization. For this reason, light energy is not utilized efficiently with any semiconductor.

Due to such inherently low efficiency, other approaches have been sought for converting solar energy into electricity. In one alternative approach an organic based solar cell has been provided (G. Yu, J. Gao, J.C. Hummelen, F. Wudl, A.J. Heeger. *Science*. 1995, 270, 1789.), a representative organic solar cell made from a polymer, poly(3-hexylthiophene), or P3HT, and phenyl-C61-butyric acid methyl ester, or PCBM. In a P3HT:PCBM solar cell, P3HT serves as an electron donor and hole conductor and the PCBM serves as an electron acceptor. The functionality of the donor-acceptor junction under light absorption strongly resembles that of the p-n junction (as illustrated in FIG. 2). When light (represented by the arrow in FIG. 2A) is absorbed, bound electron-hole pairs (the electron represented by the black circle, the hole by the white circle), or excitons, are generated primarily in P3HT as it is the more highly absorbing compared to PCBM. After this exciton is split at the donor-acceptor interface, the electron drifts to the cathode and the hole to the anode, as depicted in FIG. 2B to provide electricity.

This technology suffers in the phases of light absorption and in charge transport of photo-generated carriers (electrons and holes). The organic absorber tends to have a narrow absorption range so it does not harvest the full solar spectrum. Charge transport of photo-generated carriers is hampered because of the disorder of the material, whether it is a polymer or a small molecule. Charge transport in organic materials is typically poor in comparison to crystalline inorganic materials and, as a result, the electrons may recombine with holes before they reach the electrodes. Rather than providing electricity, these charges recombine and release light which is counter-productive. Thus, organic solar cells are limited both in terms of the amount of light absorbed and in the extraction of electricity.

Given these drawbacks of the prior art, a most viable strategy is one which aims to produce a module at low cost and reduce the BOS cost, and that requires an ultra-efficient module with the performance exceeding the Shockley-Queisser limit of 30%.

SUMMARY OF THE INVENTION

According to this invention, markedly different from either the inorganic p-n junction or the organic donor-acceptor varieties of solar cells, a circular polarizer is employed. When light strikes the circular polarizer, approximately half of the incident light is transmitted as circularly polarized before entering a layer of aluminum-doped zinc oxide. The polarized light causes the free electrons in this layer to move in a circular motion, thereby generating magnetic moments. The magnetic field generated by this electron motion drives charges in a copper electrode wound into a coil on the bottom of the device.

Not only does this device use wholly different materials from a traditional inorganic or organic solar cell, but the functionality is revamped from the ground up. There are no electron-hole pairs generated and no p-n or donor-acceptor junctions. Moreover, this device represents the first opportunity to utilize a circular polarizer and magnetism to drive solar energy conversion. Also of note is that the electrode is arranged into a coil rather than the traditional strip.

The size of each cell is determined by the area outlined by each coiled electrode. The best performing solar panel would theoretically contain a single electrode that outlines the entire panel, with an area of 40"-60" in line with conventional silicon solar panels. However, the panel would be more robust if there were several smaller cells in parallel. In this way, a failure in one cell will not cause the entire panel to fail, but just an isolated region.

BRIEF DESCRIPTION OF THE DRAWINGS

The present invention is described with respect to particular exemplary embodiments thereof and reference is accordingly made to the drawings in which:

FIG. 2A is a schematic of the energy level diagram of a donor-acceptor junction showing the generation of a bound electron (black circle)-hole (white circle) upon light absorption (arrow). FIG. 2B is a schematic showing the donor-acceptor junction after the electron has drifted to the cathode and the hole to the anode to provide electricity. (Note: bottom left and right segments represent the highest occupied molecular orbitals, or HOMOs, of P3HT and PCBM, respectively. The top left and right segments represent the lowest unoccupied molecular orbitals, or LUMOs, of P3HT and PCBM, respectively.)

FIG. 3A is a schematic cross section of the most basic solar cell structure according to one embodiment of the invention. FIG. 3B is a schematic cross section of the higher efficiency solar cell structure according to one embodiment of the invention.

DETAILED DESCRIPTION OF THE INVENTION

The foregoing detailed description of the present invention is provided for purposes of illustration and is not intended to be exhaustive or to limit the invention to the embodiments disclosed.

In the first instance, the structure and operation of the solar cell will be described, and a method for manufacturing the cell described thereafter.

FIGS. 3A and 3B are schematic cross sections of two embodiments of the invention. With reference first to FIG. 3A, a solar cell structure 100 is illustrated comprising a first, broadband circular polarizer layer 102. In one embodiment the circular polarizer layer utilizes a cholesteric liquid crystal with varying pitch deposited upon a polyethylene terephthalate substrate. In one embodiment, a polarizer material manufactured by Chelix (http://www.chelix.com/) may be employed. The material can accept unpolarized light and transmit close to 50% of this light as either left-hand or right-hand circularly polarized light and reflect the rest, at a slightly diminished rate of approximately 40%. Moreover, this effect is observed across a broad wavelength range of 340 nm-2 µm.

An alternative circular polarizer material can be purchased from American Polarizer. This variant consists of a linear polarizer on an achromic wave retarder affixed to either a glass or acrylic substrate. It is capable of polarizing the full visible spectrum. In general, any material that converts unpolarized light to circularly polarized light can be incorporated into the polarized light based solar cell. However, the system works best with broadband functionality and when the substrate is transparent.

Below circular polarizer layer 102 is a transparent conductor layer 104 which in one embodiment comprises aluminum doped ZnO. Next, below conductor layer 104 is electrically insulative layer 106 which may in various embodiments be a layer of glass or poly methyl-methacrylate.

Figure 1A:
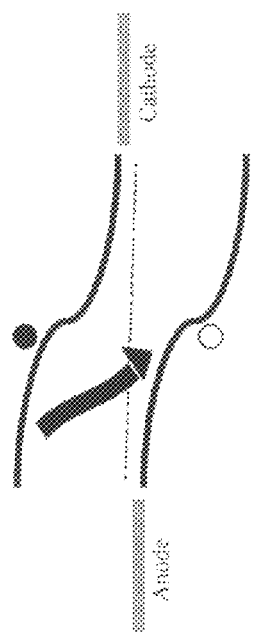
FIG. 1A is a schematic of the energy level diagram of a p-n junction showing the generation of an electron (black circle)-hole (white circle) pair upon light absorption (arrow).
Figure 1B:
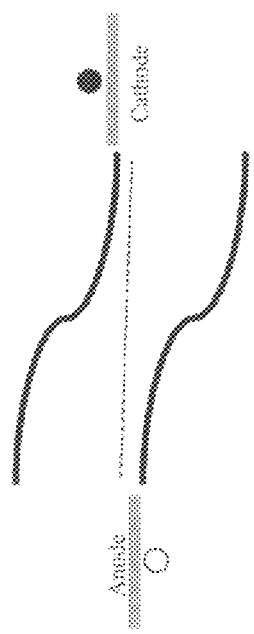
FIG. 1B is a schematic showing the p-n junction after the electron has drifted to the cathode and the hole to the anode to provide electricity. (Note: bottom black segment represents the valence band of silicon and the top segment represents the conduction band).
Figure 4A:
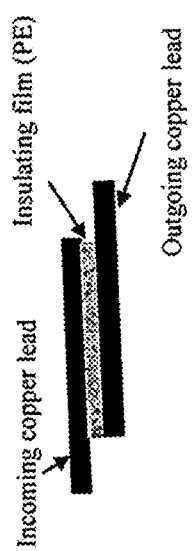
FIG. 4A is a cross sectional view of a wire loop disposed below the circular polarizer according to an embodiment of the invention.
Figure 4B:
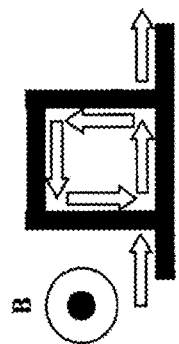
FIG. 4B is a schematic top down view of the wire loop of FIG. 4A.
Figure 5C:
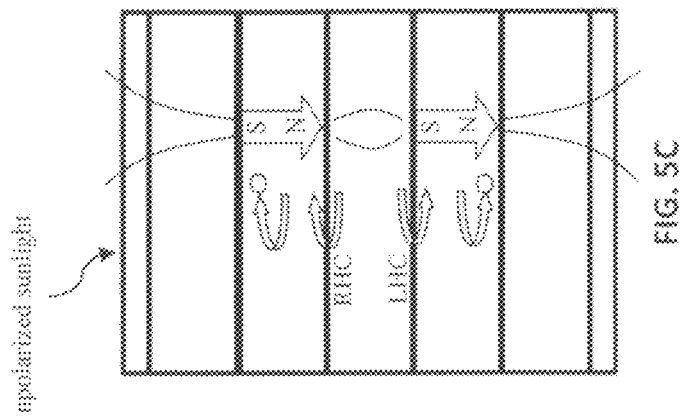
FIG. 5C is a cross sectional view of the device of FIG. 3B illustrating the device physics of the higher efficiency solar cell, which utilizes both the transmitted and reflected light from the polarizer.
Figure 5B:
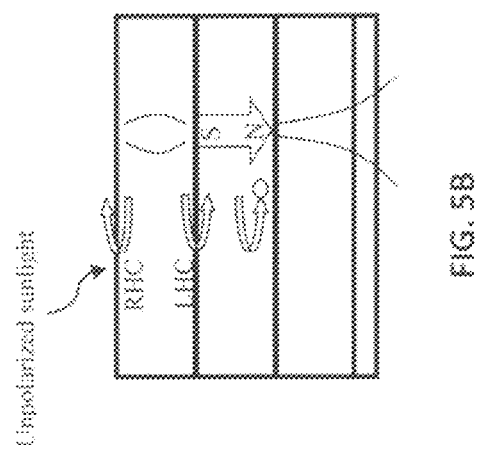
FIG. 5B is a cross sectional view of the device of FIG. 3A illustrating the device physics of the most basic solar cell, which utilizes the light transmitted through the polarizer.
Figure 5A:
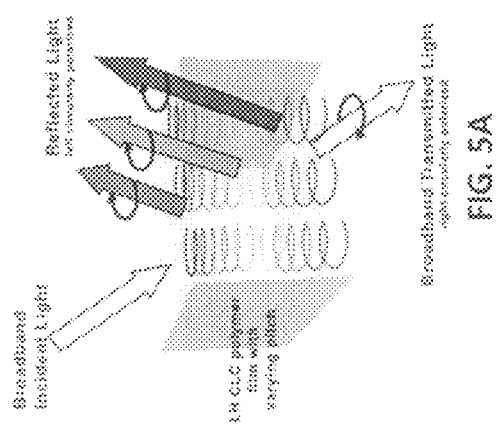
FIG. 5A is a three dimensional depiction illustrating how unpolarized incident light becomes circularly polarized (both right- and left- handed) upon striking a cholesteric liquid crystal.

Finally, a copper electrode 108 is provided on the opposite side of electrical insulator layer 106 in such fashion as to create a wire loop, as illustrated in FIGS. 4A and 4B. In FIG. 4A, a cross sectional view, the incoming copper lead and outgoing lead are separated spatially and electronically by an insulting film of polyethylene. In FIG. 4B, a plan view, the looped nature of the copper electrode is shown. Light entering the device passes through broadband circular polarizer layer 102, in which light transmitted through the layer is circularly polarized as shown in FIG. 5, transmitted as left-hand circularly polarized light and reflected as right-hand circularly polarized light. This circularly polarized light is then used to drive a current. The handedness of the polarized light is determined by the orientation of the polarizer (which side is facing up). The solar cell will function no matter which side is facing up; the only difference is that the resulting magnetic field and, therefore, the current produced will point in the opposite direction.

In the usual case it is not necessary to provide a protective layer to broadband polarizer layer 102. However in an embodiment, if desired, a protective layer (not shown), such as one made of glass, may be provided, with light passing first through the protective layer before encountering the circular polarizer layer. In yet another embodiment, a transparent conductor layer (not shown) can be interposed between the protective glass layer and broadband circular polarizer layer 102.

In a still further embodiment, illustrated in FIG. 3B, both the reflected circular polarized light and the transmitted polarized light may be used to generate a current. In this embodiment, a copper electrode in the form of a conducting metal loop 110A is formed atop an electrical insulative layer 112A, in an embodiment made of a transparent glass. In one embodiment, conducting loop 110A is the mirror image of conducting loop 108A below, at the bottom of the stack. Immediately below insulating layer 112A is a transparent conductor layer 114A, which may, as with layer 104A be formed of ZnO doped with Al, or SnO doped with either In or F. In an embodiment, ZnO:Al is preferred due to its relative abundance and low cost. In addition to high transmittance, this material also has a high carrier concentration (approximately $10^{20}$/cm3).

Next in the stack is the broadband circular polarizer layer 102A, which may be formed of the same material as described in connection with layer 102 of the embodiment illustrated in FIG. 3A. The stack is completed by second transparent semiconductor layer 104A, electrical insulator layer 106A, and copper loop 108A, which perform the same functions as layers 104, 106 and 108 of the embodiment illustrated in FIG. 3A.

Figure 6:
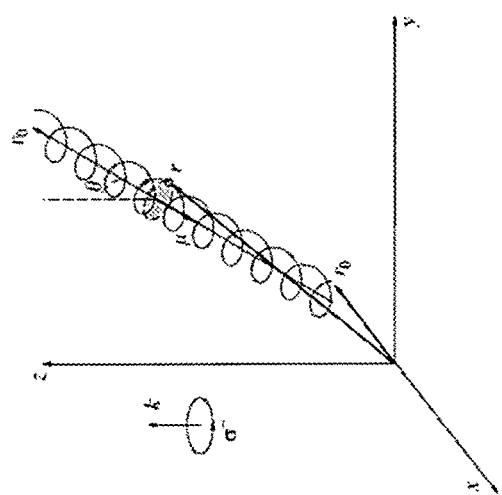
FIG. 6 is a schematic illustrating the solenoid-like current produced by an electron under the influence of circularly polarized light.

The theory of operation will now be discussed. The inverse Faraday effect, predicted by Pitaevskii in 1961 ("Electric Forces in a Transparent Dispersive Medium", *Soviet Physics Jetp-USSR* 12(5): 1008-1013), holds that a magnetic field is generated by circulating electrons driven by circularly polarized light. The mechanism resembles a microscopic solenoid, as illustrated at FIG. 6 in which a single moving electron represents the electric current, $$I = \frac{\theta \omega}{2\pi}, \tag{1}$$

which establishes a magnetic moment of $$\mu = \frac{e^s E_0^z}{2m^2 \omega^s} \cos\theta. \tag{2}$$

As for the device of the invention, unpolarized light (black curved arrow in FIG. 5B) strikes the CLC polarizer and the light emerging from the polarizer will generate magnetic moments in the transparent semiconductor on the underside. From the point of view of the polarizer, the polarized light (white curved arrows) below will drive the current (white dots) in a left-handed fashion. The magnetic moments established by each electron will uniformly have the north pole pointing down. As these charges generate magnetic moments and this flux penetrates the electrode, the energy absorbed by the light is used to drive an electric current. That is, the generated magnetic flux permeates the copper conductor wrapped into a coil on the bottom surface of the device. This current is driven by induction according to Lenz's Law. Under the influence of increasing magnetic flux (indicated by B of FIG. 4B) into the plane of the diagram, current will be driven counter-clockwise within the square loop from left to right in the incoming and outgoing leads.

It is fairly straightforward to predict an efficiency of energy conversion. Following an approach of Haines (Haines, M. G. (2001). "Generation of an Axial Magnetic Field from Photon Spin." *Physical Review Letters* 87(13): 135005-135009), Maxwell's equations when applied to circularly polarized light lead to the determination that $$\frac{\partial E_z}{\partial t} = -\frac{1}{r}\frac{\partial}{\partial r}(rE_\theta), \tag{3}$$

where $$rE_\theta = -\frac{\alpha_{ab} r}{n_e e \omega L}\frac{\partial I}{\partial r}. \tag{4}$$

In the preceding equation, $\alpha_{ab}$ is the fraction of light absorbed over a distance L, r is the distance at which the magnetic flux is detected by the electrode, I is the intensity of light, $n_e$ is the electron number density, e is the electron charge, and $\omega$ is the frequency of light. The magnetic flux, $$\varphi_B = B \cdot A, \tag{5}$$

which permeates the copper conductor wrapped into a coil on the bottom surface of the device is what establishes an electromotive force, $\epsilon$, to drive a current within the coil by induction according to Lenz's law:

$$\varepsilon = -\frac{d\phi_B}{dt}. \tag{6}$$

If reasonable values are substituted ($\alpha_{ab}$=0.5, I=1000 W/m$^2$, $\omega$=10$^{15}$s$^{-1}$, L=10$^{-6}$ m, e=1.6*10$^{-19}$, r=10$^{-7}$ m, $n_e$=1.6*10$^{16}$ m$^{-3}$), $$\frac{\partial B_z}{\partial t} = -12500 \; m^{-2}.$$

The values above are chosen for the following reasons: $\alpha_{ab}$=0.5 because the transmitted intensity is 50% of the incident intensity, I is the intensity of solar illumination, $\omega$ is approximately 10$^{15}$ s$^{-1}$ for visible light, L=10$^{-6}$ m is the distance over which light interacts with the polarizer, r=10$^{-7}$ m is the thickness of the electrode that responds to the magnetic field, and $n_e$=1.6*10$^{16}$ m$^{-3}$ is an achievable carrier concentration in semiconductors. Correspondingly, $$-\frac{\partial \phi_B}{\partial t} = -\frac{\partial B_z}{\partial t}A = \varepsilon = -.39 \; V$$

for an electrode spanning an area of 1 cm$^2$. For a copper electrode with a resistivity of 1.68*10$^{-8}$ $\Omega$m, a length of 4 cm (1 cm on each side of a square), and thickness of 100 nm, the resistance is 3.36$\Omega$. A voltage of 0.36V across a resistance of 3.36$\Omega$ generates a current of 0.12 A and a power of 45 mW. Considering that the solar flux is 100 mW/cm$^2$, this represents an efficiency of $$\frac{45 \; mW}{100 \; mW} = 45\%.$$

This efficiency represents the energy conversion of light transmitted through the cell. Additional energy could be captured by affixing a transparent conductor and electrode on top of the cell to utilize light that was reflected away from the polarizer (as illustrated in FIG. 3B).

It is important to note that in this calculation, an incident intensity of 1000 W/m² has been assumed, which is much lower than that typically used to study the Inverse Faraday Effect. In contrast, Haines routinely uses laser intensities on the order of $10^{21}$ W/m² with the understanding that the Inverse Faraday Effect is a weak phenomenon. A very large light intensity was required because the plasma that Haines studied had a free electron concentration of $2.1*10^{25}$ m$^{-3}$. Whereas here, in sacrifice of light intensity, the free electron concentration is also substantially reduced so that an appreciable magnetic flux is still observable, according to equations 3 and 4. The free electron concentration can be tuned from ~0 m$^{-3}$ in an insulator to ~$10^{26}$ m$^{-3}$ in a doped semiconductor.

The fabrication of the novel solar cell of this invention will now be described. The fabrication of the solar cell is quite straightforward, and by example will be described in connection with the embodiment of FIG. 3B. First, the transparent conductor layer 114A is deposited on glass window layer 112A, using commercially available techniques such as RF magnetron sputtering, in the case of ZnO:Al.

Next, the cholesteric liquid crystal film 102A is sandwiched between two glass wafers by vacuum filling to construct the polarizer. Conductor layer 104A below polarizer layer 102A can be separately formed using the same manufacturing techniques used to form top most conductor layer 114A, by RF magnetron sputtering of the layer (depending upon the material chosen) onto glass or a polymethyl methacrylate base 106A, the bottom section then jointed to the circular polarizer bottom surface using any transparent adhesive such as a glue.

Finally, the copper electrodes 108A and 110A can be evaporated onto the opposite sides of electrical insulator layers 106A and 110A using commercially available techniques to create the wire loops. This can be achieved using 2 evaporations. The first evaporation is performed to deposit the outgoing lead before a thin insulating film of polyethylene (PE), shown in FIG. 4A, is affixed on top the lead. The second evaporation is then performed to complete the wire loop with the incoming copper lead. The film of PE is necessary to ensure that the copper wire as formed electrically is a loop.

As for the dimensions of the solar cell, the relative thickness of the various layers depicted in FIG. 3 are not to scale, and are only representative. The size of each cell is determined by the area of each electrode coil. The area enclosed is the active area as it is this area wherein the magnetic field is generated to produce a current. The area directly above the electrode is effectively "dead space" because it cannot be used to produce electricity. For this reason, this dead space must be minimized by reducing the total space occupied by an electrode to maximize performance. In practice, however, it is risky to construct one large electrode because a failure, such as a crack, at any one part would cause the entire panel to fail. For this reason, several smaller cells will be arranged in parallel so that cell failures can be isolated and not affect the entire panel. Generally, the cells will be 130 mm×130 mm, but the manufacturer has a great deal of flexibility as to optimizing these dimensions on the basis of performance and robustness.

Figure 7:
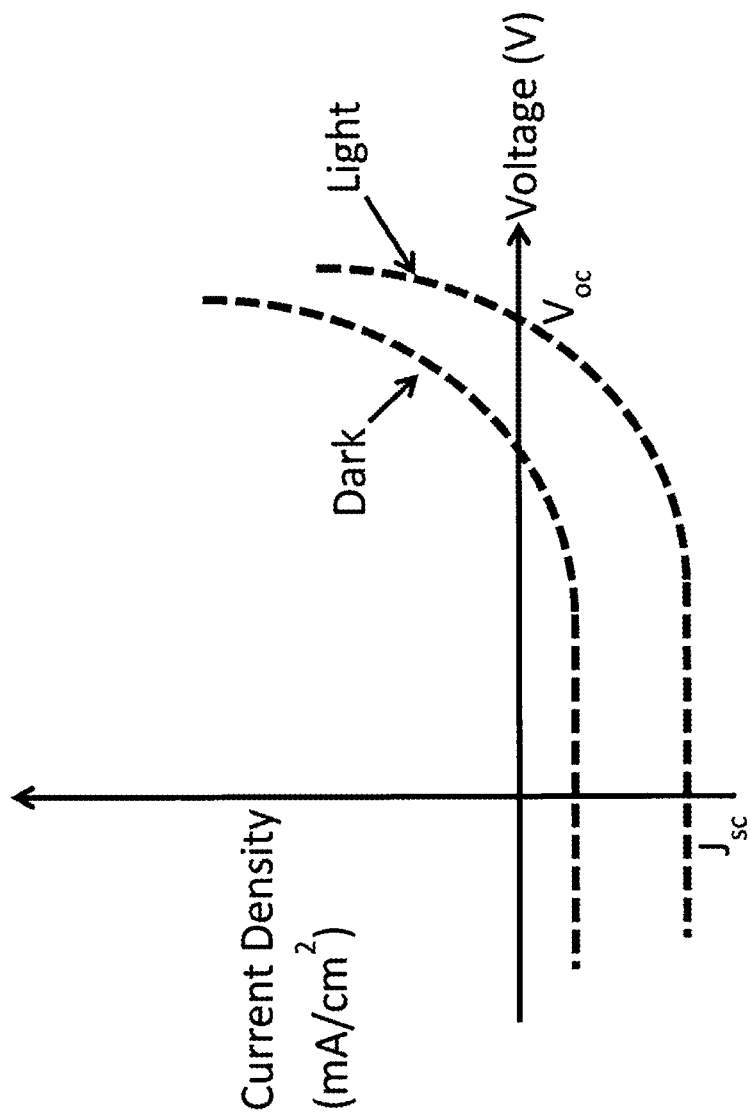
FIG. 7 is an exemplary plot of current density vs. voltage in both dark and in light.

FIG. 7 is an exemplary plot of current density for a solar cell made according to an embodiment of the invention. Both the upper and lower curves are current density vs. voltage plots with the upper curve measured in the dark while the lower curve is measured under solar intensity. The lower curve is shifted down relative to the upper curve to indicate the presence of photogenerated current. The lower curve intersects the vertical axis at the value of the short circuit current density ($J_{sc}$), the photocurrent generated at zero applied bias. When a critical applied bias is provided, the open circuit voltage ($V_{oc}$), the current can be reduced to zero, which is where the lower curve intersects the horizontal axis. As noted previously, very high efficiencies of approximately 45% may be achievable according to the novel solar cell design of the invention. The cell uses materials that are abundant and safe to use, making it commercially compatible and economically attractive.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

What I claim is:

1. A method of generating electricity including the steps of:

providing a solar cell incorporating a broadband circular polarizer, exposing said solar cell to non-polarized light, transmitting a portion of said incident light through said circular polarizer, whereby the portion of incident light transmitted is circularly polarized;

passing said circularly polarized light though a transparent conductor material;

providing an insulating layer adjacent said transparent conductor material, said insulating layer having a conductive coil in proximity therewith, positioned on its face opposite said transparent conductor layer;

inducing a current in said conductive coil as a result of magnetic fields generated by orbiting electrons driven by the passing of said circularly polarized light.

2. The method of claim 1 wherein the conductive coil is a copper coil.

* * * * *